(12) United States Patent
Kon et al.

(10) Patent No.: US 8,216,485 B2
(45) Date of Patent: Jul. 10, 2012

(54) PLASMA ETCHING METHOD, PLASMA ETCHING APPARATUS, CONTROL PROGRAM AND COMPUTER-READABLE STORAGE MEDIUM

(75) Inventors: Yoshimitsu Kon, Nirasaki (JP); Yoshinobu Hayakawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1149 days.

(21) Appl. No.: 12/023,620

(22) Filed: Jan. 31, 2008

(65) Prior Publication Data

US 2008/0185364 A1 Aug. 7, 2008

Related U.S. Application Data

(60) Provisional application No. 60/896,517, filed on Mar. 23, 2007.

(30) Foreign Application Priority Data

Feb. 6, 2007 (JP) ................................ 2007-026880

(51) Int. Cl.
B44C 1/22 (2006.01)
H01L 21/302 (2006.01)

(52) U.S. Cl. ............... 216/67; 216/41; 216/47; 216/58; 216/59; 438/706; 438/710; 438/725

(58) Field of Classification Search .................... 216/41, 216/47, 58, 67, 59; 438/706, 710, 725
See application file for complete search history.

(56) References Cited

U.S. PATENT DOCUMENTS

| | | | |
|---|---|---|---|
| 6,413,438 B1 * | 7/2002 | Ikegami | 216/67 |
| 6,828,247 B2 * | 12/2004 | Nakagawa et al. | 438/710 |
| 7,842,190 B2 * | 11/2010 | Kitamura | 216/67 |
| 2001/0041450 A1 * | 11/2001 | Matsumoto et al. | 438/710 |
| 2002/0134753 A1 * | 9/2002 | Kasai | 216/37 |
| 2003/0153193 A1 * | 8/2003 | Fuse et al. | 438/710 |
| 2003/0216004 A1 * | 11/2003 | Jeong et al. | 438/279 |
| 2004/0106293 A1 * | 6/2004 | Igarashi | 438/690 |
| 2005/0070111 A1 | 3/2005 | Kushibiki et al. | |
| 2006/0211214 A1 * | 9/2006 | Nagao | 438/424 |
| 2007/0228006 A1 * | 10/2007 | Kitamura | 216/58 |

FOREIGN PATENT DOCUMENTS

| | | |
|---|---|---|
| JP | 2001-77086 | 3/2001 |
| JP | 2001-102449 | 4/2001 |
| JP | 2002-289594 | 10/2002 |
| JP | 2004-296991 | 10/2004 |
| JP | 2005-26348 | 1/2005 |
| JP | 2006-324277 | 11/2006 |
| KR | 10-2005-0031375 | 4/2005 |

OTHER PUBLICATIONS

Chou et al, Microelectronic Engineering, vol. 5, Issues 1-4, Dec. 1986, pp. 375-386.*

Office Action issued Feb. 22, 2011, in Japanese Patent Application No. 2007-026880 (with English-language translation).

* cited by examiner

Primary Examiner — Shamim Ahmed
(74) Attorney, Agent, or Firm — Oblon, Spivak, McClelland, Maier & Neustadt, L.L.P.

(57) ABSTRACT

A plasma etching method etches an organic film formed on a target substrate by using a plasma of a processing gas via a silicon-containing mask. The processing gas is a gaseous mixture of an oxygen-containing gas, a rare gas and a carbon fluoride gas. A computer-executable control program controls a plasma etching apparatus to perform the plasma etching method. A computer-readable storage medium stores therein a computer-executable control program.

12 Claims, 3 Drawing Sheets

TEST EXAMPLE 1

TEST EXAMPLE 2

TEST EXAMPLE 1

TEST EXAMPLE 2

COMPARATIVE EXAMPLE 1

COMPARATIVE EXAMPLE 2

COMPARATIVE EXAMPLE 3

PLASMA ETCHING METHOD, PLASMA ETCHING APPARATUS, CONTROL PROGRAM AND COMPUTER-READABLE STORAGE MEDIUM

FIELD OF THE INVENTION

The present invention relates to a plasma etching method for etching an organic film formed on a target substrate via a mask of a silicon-containing film by generating a plasma of a processing gas and also relates to a plasma etching apparatus, a control program and a computer-readable storage medium to be used therein.

BACKGROUND OF THE INVENTION

Conventionally, in a manufacturing process for a semiconductor device, an etching target film, such as a silicon oxide film or the like is plasma etched via a resist mask to have a desired pattern. As for such plasma etching method, there is known a technique for performing micro-processing with a high accuracy by using a multilayer resist mask.

In a plasma etching process using the above-mentioned multilayer resist film as a mask, there is known a plasma etching method in which an organic film serving as a lower resist film is plasma etched by using a plasma of a processing gas while using a mask of a silicon-containing film formed thereon. In the plasma etching process, a single gas of $O_2$ gas, a gaseous mixture of $O_2$ gas and $N_2$ gas, a gaseous mixture of $O_2$ gas and CO gas, and a gaseous mixture of $O_2$ gas and $CH_4$ gas are used as a processing gas. Further, in the plasma etching process, a gaseous mixture of $O_2$ gas and a rare gas is also used as the processing gas (see, for instance, Japanese Patent Laid-open Application No. 2004-296991).

In the plasma etching method using the above-mentioned multilayer resist mask, the organic film is chemically etched, so that there occurs a problem that a sidewall portion of the organic film may not be etched to have a perpendicular shape. That is, the sidewall portion of the organic film may be etched excessively and curved to result in the occurrence of the so-called "bowing", or a portion under the mask may be excessively etched, resulting in the occurrence of the so-called "undercut".

SUMMARY OF THE INVENTION

In view of the foregoing, the present invention provides a plasma etching method capable of obtaining a fine etching shape by preventing the occurrence of bowing or undercut at a sidewall portion of an organic film when the organic film is plasma etched via a silicon-containing mask formed thereon. Further, the present invention also provides a plasma etching apparatus, a control program and a compute-readable storage medium to be used therefor.

In accordance with a first aspect of the present invention, there is provided a plasma etching method for etching an organic film formed on a target substrate by using a plasma of a processing gas via a silicon-containing mask, wherein the processing gas is a gaseous mixture of an oxygen-containing gas, a rare gas and a carbon fluoride gas.

It is preferable that the oxygen-containing gas is one of $O_2$ gas, CO gas and $CO_2$ gas, or a combination thereof.

The oxygen-containing gas may be $O_2$ gas and a ratio of a flow rate of the carbon fluoride gas to a flow rate of the $O_2$ gas is in a range from about 1 to 10%.

The carbon fluoride gas may be $C_4F_6$ gas and a ratio of a flow rate of the $C_4F_6$ gas to a flow rate of the $O_2$ gas is in a range from about 5 to 10%

Preferably, the carbon fluoride gas is one of $C_4F_6$ gas, $C_4F_8$ gas, $C_3F_8$ gas, $C_2F_6$ gas, $CF_4$ gas, $C_5F_8$ gas and $C_6F_6$ gas or a combination thereof.

The silicon-containing film may be one of SiON film, SiN film, $SiO_2$ film, SiC film, SiOC film, SiOCH film or a combination thereof.

In accordance with a second aspect of the present invention, there is provided a plasma etching apparatus including: a processing chamber for accommodating a target substrate therein; a processing gas supply unit for supplying a processing gas into the processing chamber; a plasma generating unit for generating a plasma of the processing gas supplied from the processing gas supply unit and processing the target substrate by the plasma; and a control unit for controlling the plasma etching method described above to be executed in the processing chamber.

In accordance with a third aspect of the present invention, there is provided a computer-executable control program for controlling, when executed, a plasma etching apparatus to perform the plasma etching method described above.

In accordance with a fourth aspect of the present invention, there is provided a computer-readable storage medium for storing therein a computer-executable control program, wherein the control program controls a plasma etching apparatus to perform the plasma etching method described above.

In accordance with the aspects of the present invention, there can be provided a method for obtaining a fine etching shape by preventing the occurrence of bowing or undercut at a sidewall portion of an organic film when the organic film is plasma etched via a silicon-containing mask formed thereon. Further, the present invention also provides a plasma etching apparatus, a control program and a compute-readable storage medium to be used therefor.

BRIEF DESCRIPTION OF THE DRAWINGS

The objects and features of the present invention will become apparent from the following description of embodiments given in conjunction with the accompanying drawings, in which.

DETAILED DESCRIPTION OF THE EMBODIMENTS

Figure 1A:
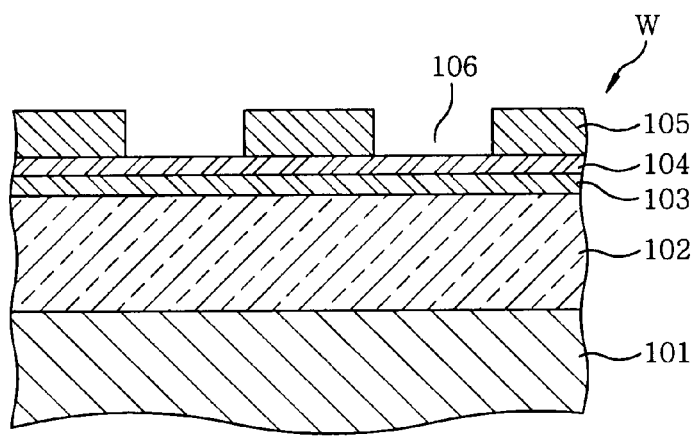
FIGS. 1A to 1C provide cross sectional views of a semiconductor wafer to which a plasma etching method in accordance with an embodiment of the present invention is applied.

The embodiments of the present invention will be described with reference to the accompanying drawings which form a part hereof. First, the configuration of a plasma etching apparatus will be explained in connection with FIG. 2.

The plasma etching apparatus includes a processing chamber 1 airtightly configured and electrically grounded. The processing chamber 1 has a cylindrical shape and is made of, e.g., aluminum. Disposed in the processing chamber 1 is a mounting table 2 for horizontally supporting thereon a semiconductor wafer W, which is a target substrate. The mounting table 2, which is made of, e.g., aluminum, is supported by a conductive support 4 via an insulating plate 3. Further, a focus ring 5 formed of, e.g., single-crystalline silicon is disposed at the periphery of the top portion of the mounting table 2. Furthermore, a cylindrical inner wall member 3a formed of, e.g., quartz or the like is provided for surrounding the periphery of the mounting table 2 and the support 4.

A first and a second RF power supply 10a and 10b are connected to the mounting table 2 via a first and a second matching box 11a and 11b, respectively. The first RF power supply 10a is for forming a plasma, and a high frequency power of a specific frequency (27 MHz or more, e.g., 40 MHz) is supplied therefrom to the mounting table 2. Further, the second RF power supply 10b is for inducing ions, and a high frequency power of a specific frequency (13.56 MHz or less, e.g., 2 MHz) lower than the frequency of the first RF power supply 10a is supplied from the second RF power supply 10b to the mounting table 2. A shower head 16 is disposed above the mounting table 2, while facing the mounting table 2 in parallel, so that the mounting table 2 and the shower head 16 are configured to function as a pair of electrodes.

An electrostatic chuck 6 for electrostatically attracting and holding the semiconductor wafer W is provided at an upper portion of the mounting table 2. The electrostatic chuck 6 is formed of an insulator 6b and an electrode 6a embedded therein, and the electrode 6a is connected to a DC power supply 12. The semiconductor wafer W is attracted and held by a Coulomb force generated by applying a voltage to the electrode 6a from the DC power supply 12.

A coolant path 4a is formed inside the conductive support 4, and a coolant entrance line 4b and a coolant exit line 4c are connected with the coolant path 4a. By circulating a proper coolant, e.g., cooling water, through the coolant path 4a, the temperature of the support 4 and the mounting table 2 is regulated at a specific temperature level. Further, backside gas supply channels 30 for supplying a cold heat transfer gas (backside gas) such as helium gas or the like to the rear side of the semiconductor wafer W is formed through the mounting table 2 and so forth. This backside gas supply channel 30 is connected to a backside gas supply source (not shown). With these configurations, the semiconductor wafer W held by the electrostatic chuck 6 at the upper portion of the mounting table 2 can be regulated to a desired temperature.

The shower head 16 serves as the ceiling wall of the processing chamber 1. The shower head 16 includes a main body 16a and a top plate 16b, and is supported at an upper portion of the processing chamber 1 via an insulating member 45. The main body 16a is formed of a conductive material, such as an aluminum of which surface is anodic oxidized, and detachably supports the top plate 16b at the lower portion thereof. The main body 16a has a gas diffusion space 16c therein, and the bottom surface of the main body 16a is provided with a plurality of gas through holes 16d placed at the bottom portion of the gas diffusion space 16c.

Further, the top plate 16b is provided with a number of gas inlet holes 16e formed through the top plate 16b in the thickness direction thereof and being overlapped with the above-mentioned gas through holes 16d. With this configuration, a processing gas supplied in the gas diffusion space 16c is dispersedly supplied into the processing chamber 1 in a shower shape via the gas through holes 16d and the gas inlet holes 16e. Further, provided in the main body 16a and the like are lines (not shown) for circulating a coolant, so that the shower head 16 can be cooled in a desired temperature during the plasma etching process.

A gas inlet opening 16f is formed at the main body 16a for introducing the processing gas into the gas diffusion space 16c. The gas inlet opening 16f is connected to one end of a gas supply line 15a, and the opposite end thereof is connected to a processing gas supply source 15 which supplies the processing gas for etching (etching gas). A mass flow controller (MFC) 15b and an opening/closing valve V1 are sequentially provided from the upstream side of the gas supply line 15a. Further, the processing gas for plasma etching, e.g., a gaseous mixture of $O_2$, Xe and $C_4F_6$, is supplied from the processing gas supply source 15 into the gas diffusion space 16c via the gas supply line 15a. Then, the processing gas is supplied from the gas diffusion space 16c into the processing chamber 1 in a shower shape via the gas through holes 16d and the gas inlet holes 16e.

A variable DC power supply 52 is electrically connected to the shower head 16 serving as an upper electrode via a low pass filter (LPF) 51. The power feed of the variable DC power supply 52 can be on-off controlled by an on/off switch 53. The current and voltage of the variable DC power supply 52 and the on/off operation of the on/off switch 53 are controlled by a control unit 60 described below. Further, when a plasma is generated in a processing space by applying the high frequency powers from the first RF power supply 10a and the second RF power supply 10b, the on/off switch 53 is turned on by the control unit 60, so that a negative DC power is applied to the shower head 16 serving as the upper electrode.

A cylindrical ground conductor 1a extends upward from a sidewall of the chamber 1 to be located at a position higher than the shower head 16. The cylindrical ground conductor 1a has a ceiling wall at the top thereof.

A gas outlet port 71 is formed at a bottom portion of the processing chamber 1, and a gas exhaust unit 73 is connected to the gas outlet port 71 via a gas exhaust line 72. By operating a vacuum pump provided in the gas exhaust unit 73, the processing chamber 1 can be depressurized to a specific vacuum level. Further, a loading/unloading port 74 for the wafer W is provided at a sidewall of the processing chamber, and a gate valve 75 for opening and closing the loading/unloading port 74 is provided thereat.

Figure 2:
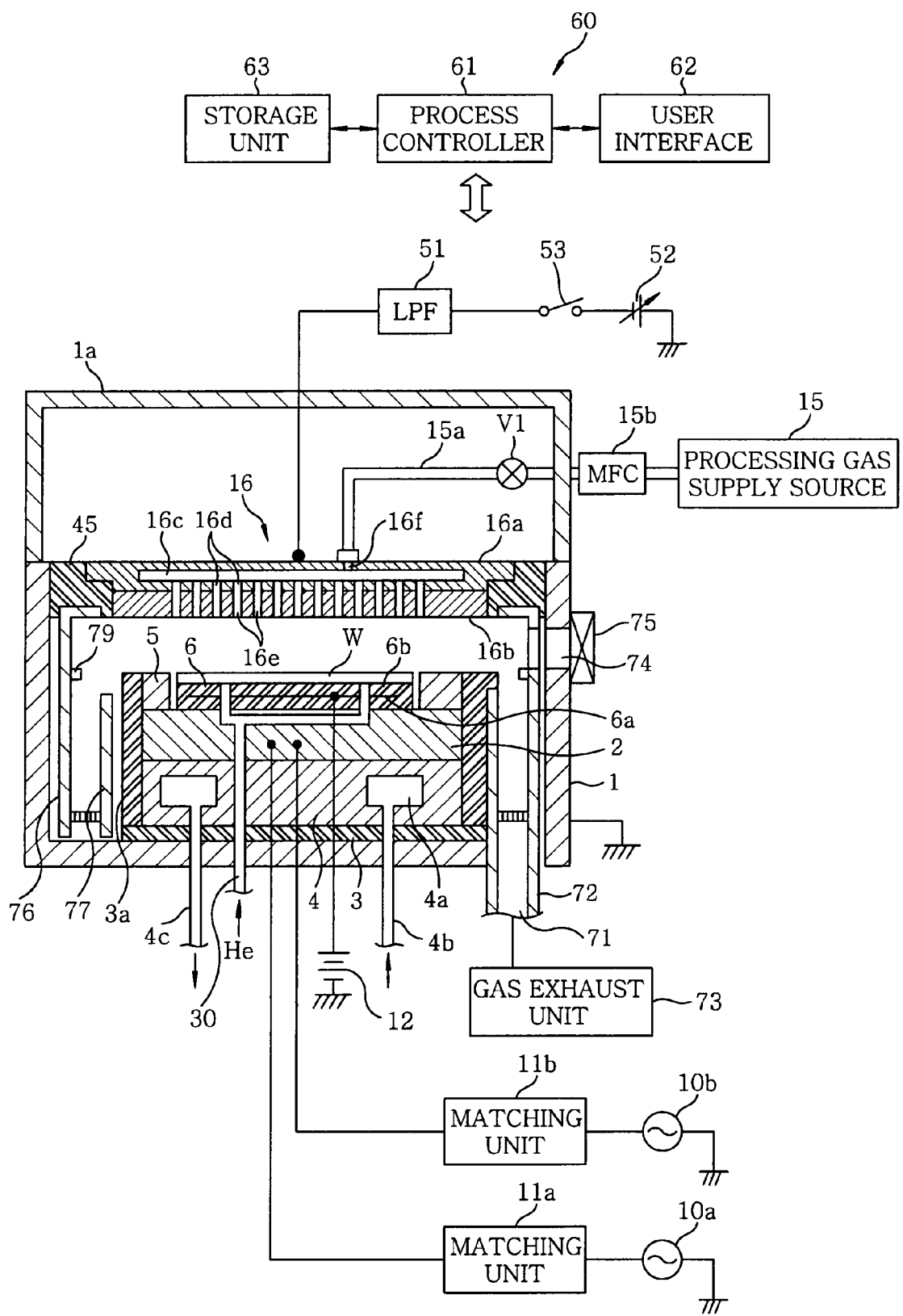
FIG. 2 is a schematic configuration view of a plasma etching apparatus in accordance with the embodiment of the present invention.

Reference numerals 76 and 77 in FIG. 2 are detachably configured deposition shields. The deposition shield 76 is installed along the inner wall of the chamber 1 so as to prevent etching byproducts (deposits) from being attached to the chamber 1. A conductive member (GND block) 79 DC-connected to the ground is provided to a portion of the deposition shield 76 at a height position substantially identical with the height of the wafer W. With this configuration, an abnormal discharge can be prevented.

The whole operation of the plasma etching apparatus having the above-configuration is controlled by the control unit 60. The control unit 60 includes a process controller 61 having a CPU and controlling parts of the plasma etching apparatus; a user interface 62; and a storage unit 63.

The user interface 62 includes a keyboard for a process manager to input a command to operate the plasma etching apparatus, a display for showing an operational status of the plasma etching apparatus, and the like.

The storage unit 63 stores therein, e.g., recipes including processing condition data and the like and control program (software) to be used in realizing various processes, which are performed in the plasma etching apparatus under the control of the process controller 61. When a command is received from the user interface 62, a necessary recipe is called from the storage unit 63 and it is executed at the process controller 61. Accordingly, a desired process is performed in the plasma etching apparatus under the control of the process controller 61. The control program and/or the recipes including the processing condition data and the like can be retrieved from a computer-readable storage medium (e.g., a hard disk, a CD, a flexible disk, a semiconductor memory, or the like), or can be used on-line by being transmitted from another apparatus via, e.g., a dedicated line, whenever necessary.

Below, there will be explained a sequence for plasma etching an organic resist film and the like formed on a semiconductor wafer W by using the plasma etching apparatus configured as described above. First, the gate valve 75 is opened, and a semiconductor wafer W is loaded from a load lock chamber (not shown) into the processing chamber 1 by a transport robot (not shown) or the like to be mounted on the mounting table 2. Then, the transport robot is retreated from the processing chamber 1, and the gate valve 75 is closed. Subsequently, the processing chamber 1 is evacuated via the gas outlet port 71 by the vacuum pump of the gas exhaust unit 73.

When the inside of the processing chamber 1 reaches a specific vacuum level, a processing gas (etching gas) is supplied from the processing gas supply source 15. While maintaining the internal pressure of the processing chamber 1 at a specific pressure level, e.g., about 1.33 Pa (10 mTorr), a high frequency power having a frequency of, e.g., about 40 MHz is supplied to the mounting table 2 from the first RF power supply 10a. Further, from the second RF power supply 10b, a high frequency power having a frequency of, e.g., 2.0 MHz is applied to the mounting table 2 for inducing ions. At this time, a specific DC voltage is applied from the DC power supply 12 to the electrode 6a of the electrostatic chuck 6, whereby the semiconductor wafer W is attracted and held by the electrostatic chuck 6 by a Coulomb force.

By applying the high frequency powers to the mounting table 2 as described above, an electric field is formed between the shower head 16 serving as an upper electrode and the mounting table 2 serving as a lower electrode. Thus, a discharge is generated in the processing space where the semiconductor wafer W is located. As a result of the discharge, a plasma of the processing gas is generated, and the organic film and the like formed on the semiconductor wafer W are etched by the plasma.

Here, since a DC voltage is applied to the shower head 16 as described above while performing the plasma processing, the following effect is obtained. That is, in a process of etching, e.g., an organic film via an inorganic film serving as a mask, a plasma having a high electron density and a low ion energy is required. Such requirement can be realized by employing an about 100 MHz RF power source for a plasma generation. In such a case, however, the power source becomes large, so that it may be advantageous to use a power source of a lower frequency.

On the other hand, if the power source having a low frequency is used, a power level needs to be set to be high to obtain the high electron density, resulting in the high ion energy. Therefore, by applying the DC voltage to the shower head 16 as described above, the ion energy supplied to the semiconductor wafer W can be restrained while maintaining the high electron density. As a consequence, an etching rate of an etching target film in the semiconductor wafer W is increased while a sputtering rate of a film serving as a mask formed on the etching target film is reduced.

After the above-described etching process is finished, the supply of the high frequency powers and the processing gas is stopped, and the semiconductor wafer W is unloaded from the processing chamber 1 in a reverse sequence to that described above.

Figure 1B:
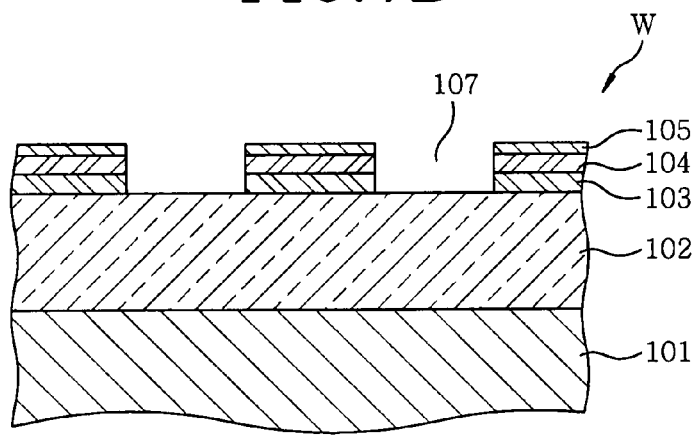
Figure 1C:
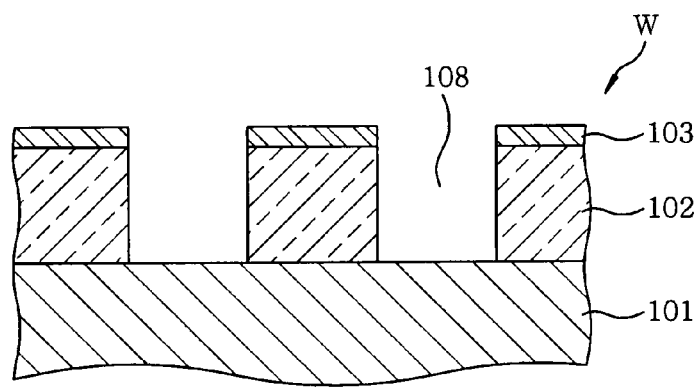

Now, a manufacturing method for a semiconductor device in accordance with an embodiment of the present invention will be described with reference to FIGS. 1A to 1C. FIGS. 1A to 1C provide enlarged configuration views of major parts of a semiconductor wafer W which is used as a target substrate in the embodiment. In FIG. 1A, an etching target film, e.g., silicon oxide film 101, is formed on a semiconductor wafer W. On the silicon oxide film 101, there is formed a multilayer resist including an organic film $10_2$ (thickness of, e.g., 400 nm) as a lower resist, SiON film 103 (thickness of, e.g., 45 nm) as a silicon-containing film, an O-ARC film (organic anti-reflection coating film) 104 (thickness of, e.g., 25 nm) and an ArF photoresist film 105 (thickness of, e.g., 60 nm) as an upper resist, which are formed in that order from a lower side. The ArF photoresist film 105 is patterned through a photolithographic process to have patterned openings 106 of a specific shape.

The semiconductor wafer W having the above-described configuration is loaded into the processing chamber 1 of the plasma etching apparatus shown in FIG. 2 and is mounted on the mounting table 2. Then, from the state illustrated in FIG. 1A, the O-ARC film 104 and the SiON film 103 are plasma etched while using the ArF photoresist film 105 as a mask, thereby forming openings 107, as shown in FIG. 1B. When plasma etching process for the O-ARC film and the SiON film 103 is completed, the ArF photoresist film remains thin.

Thereafter, from the state shown in FIG. 1B, the organic film 102 is plasma etched and openings 108 are formed, whereby the semiconductor wafer becomes in a state of FIG. 1C. In this plasma etching process, the thin remaining films such as the ArF photoresist film 105 and O-ARC film 104 are completely removed, so that the organic film 102 is finally plasma etched through the SiON film 103 patterned in the above-mentioned process. Conventionally, a single gas of $O_2$ is used for plasma etching the organic film 102. In the embodiment of the present invention, however, a gaseous mixture containing a gas containing oxygen (O), a rare gas and a carbon fluoride gas (CF based gas) is used as the processing gas for plasma etching the organic film 102.

As a Test Example 1, the above-described plasma etching process was performed on a semiconductor wafer having the same structure as that shown in FIG. 1A by using the plasma etching apparatus illustrated in FIG. 2 in accordance with a processing recipe specified below.

A processing recipe of Test Example 1 is read from the storage unit 63 of the control unit 60 and inputted to the process controller 61. The process controller 61 controls parts of the plasma etching apparatus based on the control program, so that the plasma etching process is performed according to the retrieved processing recipe as follows:

(Processing condition for plasma etching of O-ARC film and SiON film)
processing gas : $CF_4/N_2/O_2$=150/75/5 sccm;
pressure: 13.3 Pa (100 mTorr);
high frequency power (40 Mhz/2 Mhz): 1000/0 W; and
DC power: −300 V;
(Processing condition for plasma etching of organic film)
processing gas: $O_2/Xe/C_4F_6$=125/125/10 sccm;
pressure: 1.33 Pa (10 mTorr);
high frequency power (40 MHz/2 MHz): 1400/0 W; and
DC power: 0 V.

Figure 3A:
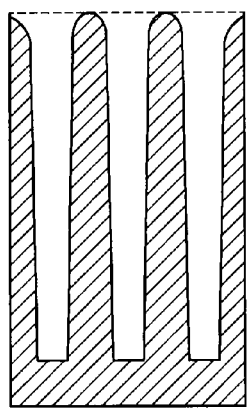
FIGS. 3A to 3E present schematic views of respective etching shapes of Test Examples and Comparative Examples.

In Test Example 1, it was confirmed that the semiconductor wafer W was etched to have a fine sidewall shape without a generation of bowing or undercut from a result of an electron microscope observation. The etching shape obtained in Test Example 1 is schematically illustrated in FIG. 3A.

Next, in Test Example 2, the processing condition for plasma etching of O-ARC film and SiON film was identical with that in Test Example 1. Further, plasma etching of the organic film was performed under the processing condition same to the Test Example 1, excepting that a flow rate of the processing gas as described below:

processing gas: $O_2/Xe/C_4F_6=200/50/10$ sccm.

Figure 3B:
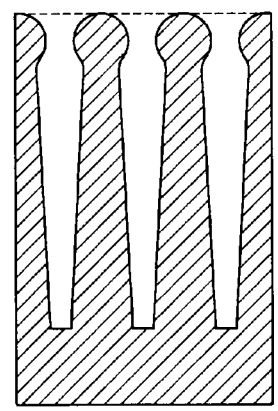

In Test Example 2, the plasma etched semiconductor wafer W was observed by the electron microscope. As a result, it was confirmed that semiconductor wafer W was etched to have a fine sidewall shape, even though the shape was inferior to that of Test Example 1 with small bowing or undercut. The etching shape of Test Example 2 is schematically presented in FIG. 3B.

Moreover, in Comparative Examples 1 to 3, the organic film was plasma etched under the processing conditions same as Test Examples 1 and 2 excepting that the processing gases were changed as described below:

COMPARATIVE EXAMPLE 1

Processing gas: $O_2=250$ sccm;

COMPARATIVE EXAMPLE 2

Processing gas: $O_2/C_4F_6=250/10$ sccm; and

COMPARATIVE EXAMPLE 3

Processing gas: $O_2/Xe=125/125$ sccm.

Figure 3C:
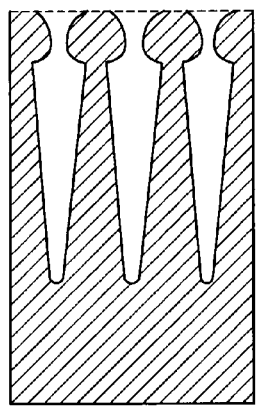
Figure 3D:
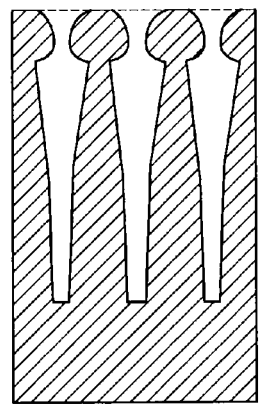
Figure 3E:
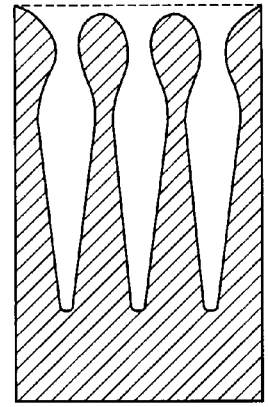

In Comparative Examples 1 to 3, the etched semiconductor wafers W were observed by the electron microscope. As a result, it was confirmed that the bowing or the undercut was remarkably generated at the sidewalls of the semiconductor wafers W in comparison with those of Test Examples 1 and 2, resulting in the deteriorated sidewall shapes. The etching shapes of Comparative Examples 1 to 3 are schematically presented in FIG. 3C to 3E.

As described above, in Test Examples 1 and 2, the generation of the bowing or the undercut was reduced in comparison with Comparative Examples 1 to 3, resulting in fine sidewall shapes. Further, when performing the plasma etching by replacing Xe gas in Test Examples 1 and 2 with Ar gas, substantially same result as in Test Examples 1 and 2 could be obtained.

The ratio of a flow rate of the $C_4F_6$ gas to a flow rate of the $O_2$ gas ($C_4F_6$ flow rate/$O_2$ flow rate) of the processing gas for etching the organic film was 8% in Test Example 1 and was 5% in Test Example 2. Further, as described above, the etching shape of the sidewall portion of Test Example 1 was more preferable than that of Test Example 2. Accordingly, it is preferable that the ratio of the flow rate of carbon fluoride gas to the flow rate of the $O_2$ gas is set to be large.

However, a large ratio of the flow rate of carbon fluoride gas to the flow rate of the $O_2$ gas tends to deteriorate an etching selectivity of the organic film to the silicon-containing film (SiON film or the like) (e.g., etching rate of organic film/etching rate of silicon-containing film) serving as a mask. An actual etching selectivity of an organic film to a silicon oxide film, which is one kind of silicon-containing films, was measured. As a result, it was found that the etching selectivity of the organic film to the silicon oxide film (etching rate of organic film/etching rate of silicon oxide film) was about 11.4 in case of Test Example 1 and was about 17.0 in case of Test Example 2.

Further, when $CF_4$ gas is used as the carbon fluoride gas for example, the adding amount of the carbon fluoride gas needs to be less than that of a case where $C_4F_6$ gas is used. That is, the ratio of the flow rate of the carbon fluoride gas to the flow rate of the $O_2$ gas is preferably in a range from about 1 to 10%. Further, when $C_4F_6$ gas is used as the carbon fluoride gas as in the cases of Test Examples 1 and 2, the ratio of the flow rate of the $C_4F_6$ gas to the flow rate of the $O_2$ gas is preferably in a range from about 5 to 10%.

Further, as the silicon-containing film serving as a mask for etching the organic film, e.g., a SiN film, a $SiO_2$ film, a SiC film, a SiOC film, a SiOCH film and the like may be used in lieu of the SiON film in the embodiment of the present invention. Moreover, the silicon-containing film may be a multi-layer containing two or more layers of SiON, SiN, $SiO_2$, SiC, SiOC, SiOCH and the like. Further, as the carbon fluoride gas, e.g., $C_4F_8$ gas, $C_3F_8$ gas, $C_2F_6$ gas, $CF_4$ gas, $C_5F_8$ gas, $C_6F_6$ gas and the like may be used instead of the $C_4F_6$ gas. Moreover, the carbon fluoride gas may include two or more gases selected among the exemplified gases, i.e., $C_4F_6$ gas, $C_4F_8$ gas, $C_3F_8$ gas, $C_2F_6$ gas, $CF_4$ gas, $C_5F_8$ gas, $C_6F_6$ gas and the like. Furthermore, although carbon fluoride gas (CF based gas) was used in Test Examples 1 and 2, it may be possible to use CHF based gas instead.

In Test Examples 1 and 2, although a single gas of $O_2$ was used as an oxygen-containing gas, a single gas of $O_2$ gas, CO gas or $CO_2$ gas or a gaseous mixture thereof may be used instead. In a case where CO gas or $CO_2$ gas is used as the oxygen-containing gas, etching rate of the organic film and etching selectivity thereof to the silicon-containing film (etching rate of organic film/etching rate of silicon-containing film) tend to be deteriorated in comparison with a case using the $O_2$ gas. For example, when the organic film was etched by using a single gas of $O_2$ (flow rate: 250 sccm; pressure: 1.33 Pa (10 m Torr); high frequency power(40 MHz/2 MHz): 1400/0 W), the etching rate of the organic film was about 807 nm/min and the etching selectivity to the silicon oxide film was about 78.8.

In contrast, when the organic film was etched by using a gaseous mixture of $O_2$ and CO (flow rate: $O_2/CO=125/125$ sccm; pressure: 1.33 Pa (10 0mTorr); high frequency power (40 MHz/2 MHz): 1400/0 W), the etching rate of the organic film was about 572 nm/min and the etching selectivity to the silicon oxide film was about 30.3. Therefore, in case of using CO gas or $CO_2$ gas, the adding amount of the carbon fluoride gas is preferably less than that of the case of the single gas of $O_2$ gas.

As described above, in accordance with the embodiment of the present invention, when the organic film is plasma etched via a silicon-containing film serving as a mask formed thereon, the occurrence of the bowing or the undercut can be prevented, so that a fine etching shape can be obtained. Further, it is to be noted that the present invention is not limited to the above embodiment but can be modified in various ways. For example, the plasma etching apparatus is not limited to the parallel plate type apparatus shown in FIG. 2 in which dual high frequency powers are applied to the lower electrode and a DC power is applied to the upper electrode, but various other plasma etching apparatuses can be used. For example, the plasma etching apparatus may be of a type in which dual high frequency powers are applied to the upper and the lower electrode or of a type in which single high frequency power is applied to the lower electrode.

While the invention has been shown and described with respect to the embodiments, it will be understood by those skilled in the art that various changes and modifications may be made without departing from the scope of the invention as defined in the following claims.

What is claimed is:
1. A plasma etching method for etching an organic film formed on a target substrate, comprising:

providing a patterned silicon-containing mask on the organic film where the organic film comprises an organic resist layer in contact with the target substrate; and etching the organic film formed on the target substrate by using a plasma of a processing gas via the silicon-containing mask, wherein the processing gas is a gaseous mixture of an oxygen-containing gas, a rare gas and a carbon fluoride gas, wherein the oxygen-containing gas is $O_2$ gas and a ratio of a flow rate of the carbon fluoride gas to a flow rate of the $O_2$ gas is in a range from about 1 to 10%.

2. The method of claim 1, wherein the carbon fluoride gas is $C_4F_6$ gas and a ratio of a flow rate of the $C_4F_6$ gas to a flow rate of the $O_2$ gas is in a range from about 5 to 10%.

3. The method of claim 1, wherein the carbon fluoride gas is one of $C_4F_6$ gas, $C_4F_8$ gas, $C_3F_8$ gas, $C_2F_6$ gas, $CF_4$ gas, $C_5F_8$ gas and $C_6F_6$ gas or a combination thereof.

4. The method of claim 1, wherein the silicon-containing mask is one of SiON film, SiN film, $SiO_2$ film, SiC film, SiOC film, SiOCH film or a combination thereof.

5. A plasma etching method for etching an organic film formed on a target substrate, the method comprising the steps of:

loading, into a processing chamber, a target substrate on which an organic film to be etched and a silicon-containing mask have been sequentially formed such that the organic film comprises an organic resist layer in contact with the target substrate, supplying a processing gas, wherein the processing gas is a gaseous mixture of an oxygen-containing gas, a rare gas and a carbon fluoride gas;

generating a plasma of the processing gas; and etching the organic film via the silicon-containing mask by using the plasma, wherein the oxygen-containing gas is $O_2$ gas and a ratio of a flow rate of the carbon fluoride gas to a flow rate of the $O_2$ gas is in a range from about 1 to 10%.

6. The method of claim 5, wherein the carbon fluoride gas is $C_4F_6$ gas and a ratio of a flow rate of the $C_4F_6$ gas to a flow rate of the $O_2$ gas is in a range from about 5 to 10%.

7. The method of claim 5, wherein the carbon fluoride gas is one of $C_4F_6$ gas, $C_4F_8$ gas, $C_3F_8$ gas, $C_2F_6$ gas, $CF_4$ gas, $C_5F_8$ gas, and $C_6F_6$ gas or a combination thereof.

8. The method of claim 5, wherein the silicon-containing mask is one of SiON film, SiN film, $SiO_2$ film, SiC film, SiOC film, SiOCH film, or a combination thereof.

9. The method of claim 1, wherein-the organic film comprises a resist for etching the target substrate.

10. The method of claim 1, wherein a range of selectivity of the organic film to the silicon-containing mask is from about 11.4 to about 17.0.

11. The method of claim 5, wherein-the organic film comprises a resist for etching the target substrate.

12. The method of claim 5, wherein a range of selectivity of the organic film to the silicon-containing mask is from about 11.4 to about 17.0.

* * * * *